United States Patent [19]

Ainsworth et al.

[11] Patent Number: 4,893,396
[45] Date of Patent: Jan. 16, 1990

[54] METHOD OF SETTING UP APPARATUS FOR HANDLING ELECTRICAL OR ELECTRONIC COMPONENTS

[75] Inventors: Steven J. H. Ainsworth; Derek R. Dane, both of Colchester, England

[73] Assignee: Emhart Industries, Inc., Hartford, Conn.

[21] Appl. No.: 295,964

[22] Filed: Jan. 11, 1989

[30] Foreign Application Priority Data

Jan. 28, 1988 [GB] United Kingdom ................ 8801897

[51] Int. Cl.4 ........................................... B23Q 17/00
[52] U.S. Cl. .................................................... 29/407
[58] Field of Search ........................ 29/407, 720, 740

[56] References Cited

U.S. PATENT DOCUMENTS 4,342,090 7/1982 Caccoma et al. ................ 29/464 X
4,475,007 10/1984 Ohno ................................ 29/464 X
4,598,456 7/1986 McConnell ...................... 29/464 X
4,776,088 10/1988 Biggs et al. ....................... 29/721 X Primary Examiner—Timothy V. Eley
Attorney, Agent, or Firm—Spencer T. Smith

[57] ABSTRACT

A component placement machine comprising an X-Y table, at least two pick-up tools movable between an up-position and a down position is set up to allow for movement of each tool in a horizontal plane in moving between its down position and its up position. A test piece is removably mounted in a pocket on the X-Y table so that it is accurately reproducibly mounted. The test piece is picked-up by a pick-up tool in its down position and a detection device detects the actual position of the piece on the tool in its up position. This is repeated for all the tools so that, when the X-Y table drive is used to compensate for variations in component position on a tool, as detected by the detection device, account can be taken of said movement in a horizontal plane.

2 Claims, 2 Drawing Sheets

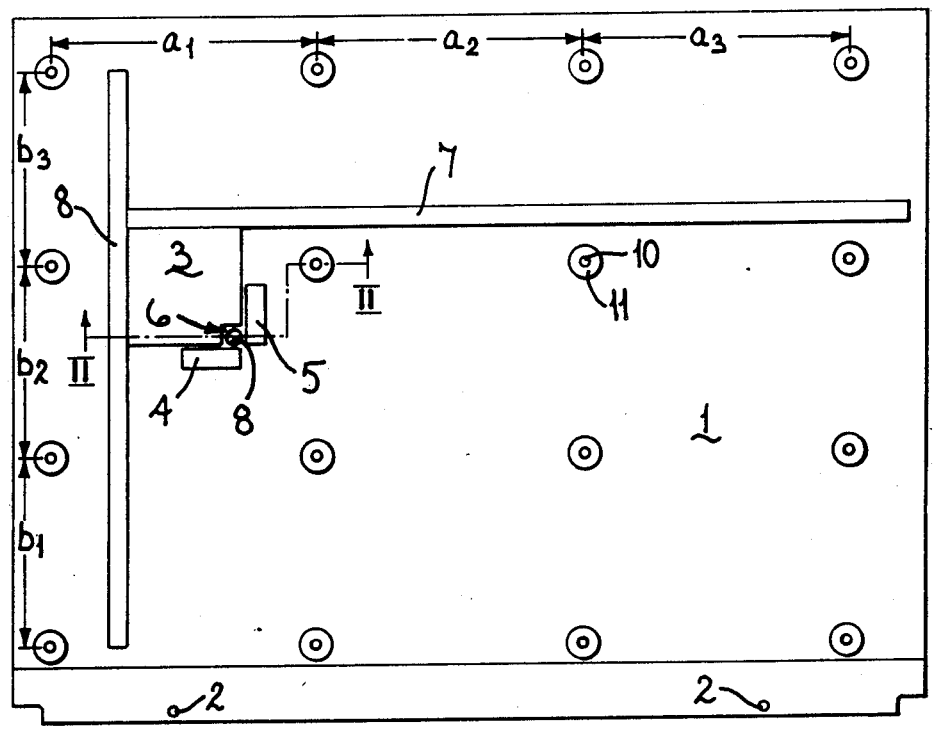
Fig_1
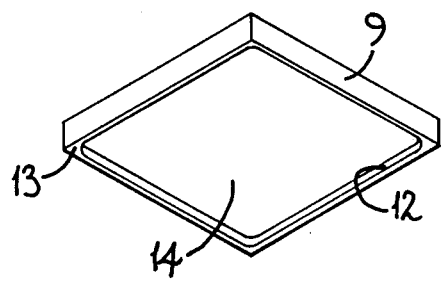
Fig_4

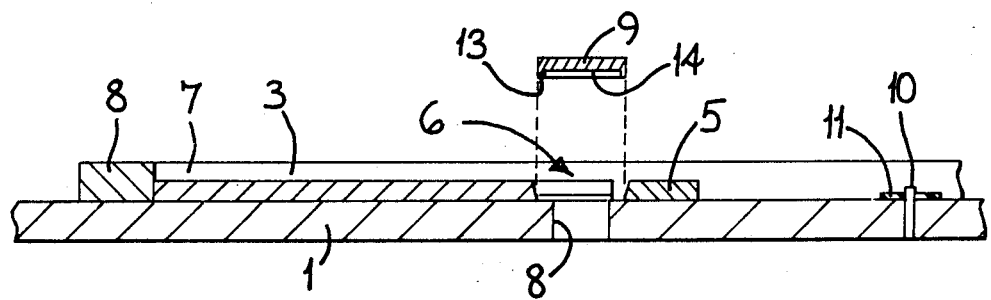
Fig_2
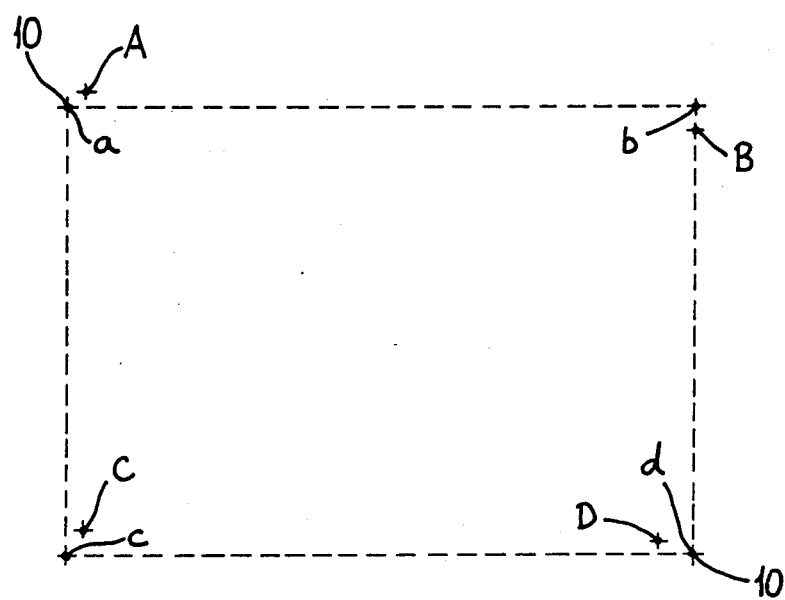
Fig_3

METHOD OF SETTING UP APPARATUS FOR HANDLING ELECTRICAL OR ELECTRONIC COMPONENTS

BACKGROUND OF THE INVENTION

This invention relates to a method of setting up apparatus for handling electrical or electronic components, for example in a component placement machine. The components may be of a variety of shapes and sizes, for example so-called flat packs, S.O style transistors, leadless chip carriers, dual in line packages, melf type components and the like, as well as so-called "chips".

In the manufacture of electrical or electronic apparatus it is necessary to assemble a plurality of components on a suitable substrate, for example a printed circuit board. A number of systems have been proposed for handling the components to be placed on a substrate and many of these have proposed the use of pick-up heads having a suitable tool by which a component may be picked up. The tools have been of various types, depending to some extent on the components to be handled; for example the tools may grip the components mechanically or may use suction or a magnetic system to retain a component on the tool of the pick-up head when the component is removed from a suitable component supply means for delivery elsewhere, for example to a suitable placement position where the component may be placed on a substrate e.g. a printed circuit board. It is important to ensure that the components are correctly oriented when placed on the substrate and a number of methods have been proposed to attempt to ensure correct orientation.

In component placement machines of the type described, the substrate, for example a printed circuit board, on which the components are to be placed, is mounted in an accurately known position on an X-Y table, suitably mounted on a frame. The X-Y table may be mounted and driven by any suitable means, a number of which are known, and one such means for mounting and driving an X-Y table is described by way of example in our PCT Patent Application Publication No. W.O. 85/03404.

Whilst the movement of the X-Y table can in theory be determined accurately an precisely by control of its drive mechanism, there can in practice be some deviation between the theoretical and the actual response of the table to the drive mechanism. This can result in a deviation from the intended location of the X-Y table, and hence the substrate mounted on it, which can lead to inaccurate placement of a component on the substrate.

Clearly if this inaccuracy in placement of the component exceeds any permissible tolerance, then an unacceptably high reject rate for the completed substrates will result.

An improved method of setting up a component placement machine in which any inaccuracy in the positioning of a point on a substrate mounted on the X-Y table relative to a reference point, which inaccuracy is due to the response of the X-Y table to its drive system, is reduced or substantially obviated, is described and claimed in our co-pending U.S. patent application Ser. No. 295,968 filed 1/11/89.

In our U.S. patent application Ser. Nos. 150,101, filed 1/29/89, 150,128 filed 1/29/88 and 149,799 filed 1/29/89, a component placement machine is described by way of example in which a plurality of pick-up heads each provided with a pick-up tool, are mounted on a support, and, in operation means are provided for moving the pick-up heads through a number of stations at which operations such as pick-up, inspection and placement may be carried out. In the inspection operation, the position of the component relative to the pick-up tool is detected and a correction is applied to the X-Y table drive for any deviation of the component from a reference position. The position of the component is detected by a CCD camera looking upwards at the component and the orientation of the component can also be detected and corrected by rotation of the tool about a vertical axis.

In such a component placement machine, in operation, the pick-up head has an up-position and a down-position, and can be moved between the up-position and the down-position. The pick-up head carries out its pick-up and placement operations while in the down-position but the inspection is carried out in the up-position. The placement is rendered less accurate by any movement in a horizontal plane of the pick-up tool in moving from its down-position to its up-position as such movement leads to the position of the component detected in the inspection operation, which includes this movement, not being an accurate reflection of the position of the component when placed. This movement may be different for each pick-up tool. Thus, this movement in a horizontal plane leads to placement inaccuracies.

SUMMARY OF THE INVENTION

An object of the present invention is to provide a method of setting up a component placement machine in which the movement in a horizontal plane of each tool in moving from its down-position to its up-position is determined, so that allowance may be made for this movement.

The invention provides a method of setting up a component placement machine comprising an X-Y table on which substrates on which components are to be placed may be mounted, at least two pick-up heads each having a pick-up tool movable between an up position and a down position in which the tool can pick-up a component for placement or release the component on to a substrate on the X-Y table, and a detecting device for inspecting components held by the pick-up tools at an inspection station of the machine, the method comprising the steps of:

(a) mounting a removable test-piece on the X-Y table in location means arranged to enable the test piece to be accurately reproducibly mounted on the X-Y table;

(b) picking up the test piece from the X-Y table using a pick-up tool of the machine, the test-piece being picked up in the down position of the tool;

(c) moving the pick-up head to which the pick-up tool belongs to the inspection station.

(d) utilising the detecting device to detect the actual position of the test-piece in the up position of the pick-up tool relative to a reference position of the detecting device;

(e) recording the error between said actual position and said reference position; and (f) repeating steps (a) to (e) for each tool.

In a method according to the last preceding paragraph, the movement in a horizontal plane aforementioned is determined by a comparison of the detected position of the test piece when the tool is in its up-position with the known position of the test piece when the tool is in its down-position, the known position being assured by the location means.

The test-piece used may be in the form of a block, e.g. of aluminium and the location means comprise a pocket on a setting-up plate mounted on the X-Y table, the block being a close fit in the pocket. The setting-up plate may also have fiducial marks thereon for use in detecting errors in the drive of the X-Y table by a method as described in our aforementoned co-pending U.S. patent application No. 295,968 filed 1/11/89. The walls of the pocket may incline inwardly so as to tend to centre the block in the pocket.

The test-piece used may have areas of contrasting colour on its surface which is presented to the detecting device and the detecting device be arranged to detect the actual position of the test piece by detection of said areas. This enables greater accuracy of detection by providing greater contrast than may exist between the test-piece and the background. In particular, said areas of contrasting colour may comprise a rim area extending around the periphery of the test-piece and a central area surrounded by said rim area. This arrangement allows variations in the illumination level to be taken into account. It is found, in practice, that as illumination increases bright areas appear larger to a detecting means such as a CCD camera whereas dark areas appear smaller. By utilising a dark area within a bright area or vice versa, detecting both areas and averaging the result, it is possible to achieve accuracy over a wide range of illumination. Conveniently, the test-piece can have a central area recessed relative to the rim area, the whole surface can be coated with black stove enamel and the paint can be removed from the rim area.

In order to achieve greater accuracy, steps (a) to (e) of the method may be repeated one or more times for each tool with the errors of each tool being averaged.

The method may also comprise utilising the detecting device to detect the position of the pick-up tool in its up-position relative to the reference position of the device and the detected position may be used as a centre of rotation for orientation of components picked up by the tool. Thus, as the position of the pick-up tool is accurately known in its up-position, the effects of rotation of a component about this axis can be calculated and allowed for in the drive of the X-Y table.

In a preferred embodiment of the method according to the invention, the detecting device preferably comprises a pattern recognition camera, in particular a CCD (charge coupled device) camera, in which an array of sensors survey the field of view and can detect and record the position of an object in the field of view relative to a reference point of the camera. The use of a camera, in particular a CCD camera, makes it possible for the position of the pick-up head to be recorded quickly and accurately.

The method according to the invention is particularly suitable for use in setting-up component placement machines having a turret on which a number of heads, for example, ten, are spaced at approximately equal angles around a central axis. The turret is driven to bring each head in turn into position at a particular station, e.g. an orientation, inspection or placement station. While the heads are nominally spaced at equal angles around the turret, the usual manufacturing tolerances may lead to some variations between the positions of individual heads. By utilising the method according to the invention, allowance may be made for these variations.

The invention described and claimed in our aforementioned co-pending British Patent Applications No. 8801896 and No. 8811253 provides a method of setting up a component placement machine, comprising a pick-up head having a pick-up tool, and an X-Y table on which substrates on which components are to be placed may be mounted to account for errors in the X-Y table drive utilising a detecting device operable to detect the position of a fiducial mark, i.e. a mark whose position is precisely known relative to location points of a plate on which the mark is located, relative to a reference point of the device, comprising the steps of:

(a) mounting a setting-up plate, provided with an array of fiducial marks, having accurately known x,y coordinates relative to the plate, in an accurately known position on the X-Y table by means of aligning location points of the X-Y table and the setting-up plate;

(b) informing a control system of the table drive of said known x,y coordinates of the fiducial marks in the array;

(c) causing the control system to drive the X-Y table to a position where the reference point of the detecting device is expected to coincide with one of said fiducial marks;

(d) utilising the detecting device to detect the actual position of said mark relative to the reference point;

(e) determining the error between said actual position and said reference point and;

(f) repeating steps (c) to (e) for each mark in the array.

By utilising a method according to the last preceding paragraph, corrections can be made for the errors in the X-Y table drive. In driving to a particular position, the known errors in driving to the positions of fiducial marks adjacent to said particular position can be taken into account to produce a more accurate drive.

In a preferred embodiment of the method according to the invention, described and claimed in said co-pending British Patent Applications the method further comprises the step of:

(g) driving the X-Y table to the fiducial mark positions applying a correction which takes account of the errors determined in step (e) and (h) checking that the error at each fiducial mark point is within an acceptable tolerance.

By incorporating steps (g) and (h) in the method according to the invention described and claimed in said co-pending British Patent Applications, it is possible to confirm that appropriate corrections are being made for the errors in the X-Y table drive.

The detecting device preferably used in the method according to the invention described and claimed in said co-pending British Patent Applications is a pattern recognition camera, in particular a charge coupled device (CCD) camera, in which an array of sensors survey the field of view, and can detect and record the x,y coordinates of a point in the field of view relative to a reference point of the camera. In the method according to the invention described and claimed in our co-pending application, the point in the field of view is the fiducial mark. The use of a camera, in particular, a CCD camera, makes it possible for the position of the fiducial mark to be detected and recorded quickly and accurately.

Advantageously, the location means for the test-piece may be mounted on the setting-up plate on which the fiducial marks are provided. Furthermore, if the location means are first moved by operation of the X-Y table drive to bring the test piece into position to be picked up, it is advantageous if said fiducial marks are first used, as described above, to detect errors in said drive.

BRIEF DESCRIPTION OF THE DRAWINGS

A preferred method of setting up a component placement machine according to the invention will now be further described with reference to FIGS. 1 to 4 of the accompanying drawings, in which;

FIG. 1 shows a plan view of the setting-up plate;

FIG. 2 shows a section along line II—II of FIG. 1; and

FIG. 3 shows the method of calculating the correction for any point on the plate; and FIG. 4 is a perspective view of a test-piece used in the preferred method.

DETAILED DESCRIPTION OF THE INVENTION

The preferred method is used in setting up a component placement machine which comprises an X-Y table on which substrates on which components are to be placed may be mounted, and ten pick-up heads mounted on a turret each having two pick-up tools movable between an up position thereof and a down position thereof in which the tool can pick-up a component or release the component onto a substrate on the X-Y table. The heads are pivotal about vertical axes to bring the tools into operative position (each tool of a head being appropriate to a particular size or shape of component). The method is intended to account for any movement in a horizontal plane of the pick-up tools in moving from their down-positions to their up-positions and for errors in the X-Y table drive of the component placement machine. The machine also comprises a detecting device in the form of an upwardly-looking CCD camera (not shown) at an inspection station and having a reference point at the centre of its field of view. The camera is for inspecting components held by the pick-up tools at the inspection station. A setting-up plate (1) is mounted in an accurately known position on the X-Y table by means of aligning location points (2) of the X-Y table and the setting-up plate.

The plate (1) comprises an aluminium plate on which is mounted a housing comprising a plate (3) and two stainless steel strips (4,5). The plate (3) is substantially square in shape, a square portion having been cut away from one corner to leave a pocket (6). The strips (4,5) are mounted on the plate at right angles to each other, adjacent to the cutaway portion of the plate (3), so defining the remaining sides of the pocket (6). For ease of manufacture, two longer stainless steel strips (7,8) are mounted on the plate to assist precise location of the plate (3).

The walls of the pieces (3,4,5) which define the pocket (6), are inclined inwardly, as can be seen in particular in FIG. 2.

A removable test-piece in the form of a square block (9) made of aluminium is designed to fit closely into the pocket (6). The inclined walls of the pocket (6) tend to centre the block (9) in the pocket. The block (9) has a square recess (12) in one surface thereof and the block is painted black in this recess. Thus, the test-piece has areas of contrasting colour on its surface which is the surface thereof to be presented to the camera. The contrasting areas are, thus, a rim area (13) extending around the periphery of the test-piece around the recess (12), the area (13) being the colour of aluminium, i.e. silver, and a central area (14) within the recess (12), surrounded by the rim area, which is black. The camera is arranged to detect the actual position of the test-piece by detection of the areas (13 and 14). The pocket (6) forms location means arranged to enable the block (9) to be accurately reproducibly mounted on the X-Y table.

At the pocket (6), a hole (8) is drilled through the plate (1). This hole (8) assists removal of the block (9) from the space (2) and prevents it becoming jammed therein.

In addition sixteen pins (10) are mounted on the plate (1) in a four by four array. The distances $a_1$, $a_2$, $a_3$ etc. between adjacent pins in the x-direction are nominally the same and the distances $b_1$, $b_2$, $b_3$ etc. between adjacent pins in the y-direction, are also nominally the same though not necessarily the same as the inter-pin distances in the x-direction, and are measured accurately for every inter-pin distance by known means.

The temperature at which these measurements are carried out is recorded and is marked on the plate. When the plate is subsequently used in the preferred method in the setting-up of a component placement machine, the setting up is carried out at a temperature in the range of the measuring temperature ±5° C. in order substantially to obviate any error due to thermal expansion or contraction of the setting-up plate.

The area of the plate (1) covered by the array of pins (10) is substantially equal to the effective working area of the X-Y table, that is the area on which components are to be placed, of a substrate which is to be mounted on the table. The pins are drilled into the plate to ensure secure fixing, and each pin may be provided with a collar (11), suitably of black rubber, to give a dark background to the pin to assist detection by a downwardly-looking CCD camera located above the X-Y table and having a reference point.

To carry out the preferred method the control system of the X-Y table is informed of the x,y coordinates of each of the pins on the setting-up plate mounted on the X-Y table, and the X-Y table is driven by means of its control system to the position where the reference point of the downwardly-looking CCD camera is expected to coincide with a first pin i.e. the drive attempts to position the table so that the reference point of the camera is at the known x-y coordinates of the first pin.

The actual position of the pin relative to the reference point is detected using the downwardly-looking CCD camera, and the difference between the expected x- and y- coordinates and the actual x- and y- coordinates is measured and recorded. Thus, the error at the pin is determined.

The X-Y table is then driven by means of its control system to the position where the reference point of the downwardly-looking CCD camera is expected to coincide with the known x,y coordinates of a second pin, and the steps of detection, measurement and recording are repeated for this pin.

This process is repeated in turn until the error in the X-Y table drive has been calculated for each pin position.

In order to check that the errors have been correctly calculated and recorded, the X-Y table is then driven under its control system to each pin position, applying a correction which takes account of the errors determined, and the downwardly-looking CCD camera is used to check that the error at each pin position is within an acceptable tolerance. If not, the method is repeated for that pin. In order to explain more clearly how the measurements taken in the setting-up process can be used in the control system of the X-Y table to correct for errors, an example of the calculation required will now be given, with particular reference to FIG.3 of the accompanying drawings, in which any four adjacent pins a, b, c and d of the array are shown at known coordinates $a_x$, $a_y$; $b_x$, $b_y$; $c_x$, $c_y$; and $d_x$, $d_y$. These pins were detected at A, B, C and D and found to have coordinates of $A_x$, $a_y$; $B_x$, $B_y$; $C_x$, $C_y$; and $D_x$, $D_y$, $A_x$ being $a_x$ plus the x error detected at a, and so on.

When scaling generally along the x axis between points C and D the x axis scaling factor is given by $$(D_x - C_x)/(d_x - c_x)$$

and this is multiplied by x to give the corrected value X at any point along the line between c and d.

Thus, $X = ((D_x - C_x)/(d_x - c_x)) \, x$
or $X = x \pm (((D_x - C_x)/(d_x - c_x)) - 1) \, x$
or $X = x \pm (D_x - C_x - d_x \pm c_x) x/(d_x - c_x)$.
so that the scaling factor $K = (D_x - C_x - d_x \pm c_x)/(d_x - c_x)$.

Similarity scaling between points A and B along the x axis gives a scaling factor $L = (B_x - A_x - b_x \pm a_x)/(b_x - a_x)$.

Now considering variable x scaling depending on y, this is given by $X = x \pm Lx \, (y/(a_y - c_y)) \pm Kx \, (1 - (y/(a_y - c_y)))$
or $X = x \pm Lx \, (y/(a_y - c_y)) \pm Kx - Kx \, (y/(a_y - c_y))$
or $X = x \pm Kx \pm ((Lx - Kx)/(a_y - c_y)) \, y$
or $X = x \pm Kx \pm Mxy$, where
$M = (L - K)/(a_y - c_y)$ If point c is taken as a reference, i.e. (0,0) for any value of y if x = 0 then the scaling is also 0, therefore, any x displacement is due to axis skew.

Axis skew on line c to a is
$((A_x - C_x) - (a_x - c_x))/(a_y - c_y)$
$X = ((A_x - C_x - a_x \pm c_x)/(a_y - c_y)) \, y$
$X = Ny$ where $N = (A_x - C_x - a_x \pm c_x)/(a_y - c_y)$.

So the total correction is given by $X = x \pm Kx \pm Mxy \pm Ny$ and hence this is the algorithm calculated for the x drive correction for driving to any point within the rectangular area bounded by a, b, c and d which is based on the coordinates of a, b, c and d and of A, B, C and D.

By a similar calculation on the y axis,
$Y = y \pm Py \pm Sxy \pm Tx$, which is the algorithm for y drive correction
where $P = (A_y - C_y - a_y \pm c_y)/(a_y - c_y)$
$S = (R - P)/(d_x - c_x)$ where $R = (B_y - D_y - b_y \pm d_y)/(b_y - d_y)$
and $T = (D_y - C_y - d_y \pm c_y)/(d_x - c_x)$.

To further carry out the preferred method, with the setting-up plate (1) mounted in an accurately known position on the X-Y table by means of aligning location points (2) of the X-Y table and the setting-up plate (1) as aforementioned, the test-piece (9) is placed in its pocket (6) with the surface thereof having the areas (13 and 14) down. Thus, the test-piece is removably mounted on the X-Y table in an accurate reproducible position.

One of the heads is then driven to the placement station, where one of its tools can pick up from the X-Y table. The X-Y table is then driven to locate the removable test piece where it can be picked up by the tool. This driving takes into account errors in the X-Y table drive derived from observations of the pins (10) as described. The tool is then utilised to pick-up the test piece. The test-piece, thus, being picked up in the down position of the tool. The head is then moved to the inspection station where the CCD camera is used to detect the actual position of the test piece on the tool in the up-position of the pick-up tool relative to the reference position of the camera, and the error between said actual position and said reference position is recorded.

The steps of driving the head to the placement station, picking up the test piece and then detecting its actual position and recording the error are then repeated twice, making a total of three times, and the results are averaged. This process is repeated for each tool to give an averaged error for each tool.

The results obtained are used to correct the X-Y table drive to take account of the aforementioned movement in a horizontal plane. The upwardly-looking CCD camera is also used to detect the position of a pick-up tool in its up-position relative to a reference position of the camera and the detected position is used as the centre of rotation for orientation of components picked up by that tool. Thus, as it is known about which axis a component will be turned to correct its orientation, the displacement caused by any displacement of this axis from the centre of a component can be taken into account in the X-Y table drive.

The illustrative method enables the variations between the pick-up tools and in the X-Y table drive to be taken into account.

We claim:

1. A method of setting up a component placement machine comprising a substrate supporting X-Y table, a head having a tool displaceable between an up position and a down component pick up/deposit position, the head movable, with the tool at the up position, to locate the tool at pick up, inspection and deposit locations, comprising
    removably mounting a test component on the X-Y table at a precise X-Y location,
    picking up the removably mounted test component with the tool,
    displacing the tool to the up position and moving the head to locate the tool at the inspection station and
    inspecting the test electronic component held by the tool at the inspection to determine its X-Y location, and
    comparing the actual and theorretical X-Y locations and determining X, Y corrections for such tool as it is displaced between the inspection location and the deposit location.

2. A method according the claim 1, wherein the test electronic component is non circular, further comprising
    removably mounting the test component ta a precise orientation,
    inspecting the test electronic component held by the tool at the inspection station to determine its orientation and
    comparing the actual orientation and the theoretical orientation of the test electronic component based upon the precise orientation of the test electronic component removably supported on the X-Y table and the displacement thereof to the inspection station and determining the orientation correction for such tool as it is displaced between the inspection location and the deposit location.

* * * * *